United States Patent [19]
Ko et al.

[11] Patent Number: 5,436,466
[45] Date of Patent: Jul. 25, 1995

[54] SEMICONDUCTOR LASER DIODE

[75] Inventors: Hyun C. Ko; Ki W. Jung, both of Seoul; Jong S. Kim, Dalseo; Won J. Choi, Anyang, all of Rep. of Korea

[73] Assignee: Goldstar Co., Ltd., Seoul, Rep. of Korea

[21] Appl. No.: 105,791

[22] Filed: Aug. 12, 1993

[30] Foreign Application Priority Data

Aug. 19, 1992 [KR] Rep. of Korea ............... 14906/1992

[51] Int. Cl.$^6$ ............................................. H01L 33/00
[52] U.S. Cl. ........................................ 257/13; 257/94; 257/96; 257/97; 257/183
[58] Field of Search ....................... 257/13, 94, 96, 97, 257/183

[56] References Cited

U.S. PATENT DOCUMENTS 5,198,686 3/1993 Yoshimura ........................... 257/94

Primary Examiner—Mark V. Prenty
Attorney, Agent, or Firm—John P. White

[57] ABSTRACT

A semiconductor laser diode of a double hetero structure including a semiconductor substrate, a buffer layer, a clad layer of a first conductivity type, an active layer and a clad layer of a second conductivity type, all layers being sequentially formed over the substrate, characterized by an intermediate layer interposed at at least one of a region between the substrate and the first clad layer and a region between the second clad layer and the cap layer, the intermediate layer being adapted to reduce a series resistance component and thus make a flow of current smooth.

7 Claims, 3 Drawing Sheets

SEMICONDUCTOR LASER DIODE

BACKGROUND OF THE INVENTION

1. Field of the Invention

The present invention relates to semiconductor laser diodes, and more particularly to semiconductor laser diodes with the double hetero junction structure.

2. Description of the Prior Art

Referring to FIG. 1, there is illustrated a semiconductor laser diode with a conventional double hetero junction structure of the inner stripe type. As shown in FIG. 1, the semiconductor laser diode has a semiconductor substrate 11, a buffer layer 12, a clad layer 13 of a first conductivity type, an active layer 14, a clad layer 15 of a second conductivity type, a current limitation layer 16 and a cap layer 17, all layers being sequentially grown over the substrate 11. The semiconductor laser diode also has a metal electrode 18 of the first conductivity type and a metal electrode 19 of the second conductivity type grown beneath and over the substrate 11, respectively.

In this structure, current introduced in the laser diode through the second conductivity type metal electrode 19 is limited by the current limitation layer 16 while passing through the cap layer 17. As a result, the current is introduced in the second conductivity type clad layer 15 at a current density. The current is radiative recombined in the active layer 14 and then introduced in the first conductivity type metal electrode 18 via the first conductivity type clad layer 13, the buffer layer 12 and the substrate 11.

The active layer 14 has a smaller energy band gap and a larger refractive index than those of the clad layers 13 and 15 disposed over and beneath the active layer 14. With such characteristics, electrons and holes are gathered in the active layer. Also, light radiated is concentrated by the active layer 14, because of the refractive index difference between the active layer 14 and each of the clad layers 13 and 15, so that the oscillation initiating current becomes lowered.

The buffer layer 12 serves to buffer crystal defects present in the substrate 11, so as to obtain a better crystal layer.

When current is injected into the above-mentioned semiconductor laser diode, however, a flow of current feels a barrier caused by the large energy band gap difference between the cap layer 17 and the second conductivity type clad layer 15 or between the substrate 11 (or the buffer layer) and the first conductivity type clad layer 13. As a result, a resistance component against the flow of current is generated, resulting in a generation of heat. This results in a degradation in electrooptical characteristics of devices.

In FIG. 4, there is illustrated an energy band structure of the conventional laser diode.

Referring to FIG. 4, it can be found that a high barrier of the spike type occurs due to discontinuous energy levels, in particular, at boundaries between the cap layer 17 and each of the clad layers 13 and 15 and between the substrate 11 and each of the clad layers 13 and 15. Due to the barrier, flowing of electrons and holes are limited, thereby causing parasitic radiative resistance components to be generated.

As a result, the operating current becomes higher, thereby resulting in a radiation of heat and a degradation in reliability. Moreover, an undesirable phenomenon such as a variation in wavelength of emitted light may occur due to the radiation of heat.

SUMMARY OF THE INVENTION

Therefore, an object of the invention is to solve the above-mentioned problems encountered in the prior art and thus to provide a semiconductor laser diode capable of reducing the series resistance component and thus operating with low current, by an intermediate layer interposed between its clad layer and its current limitation layer.

In accordance with the present invention, this object can be accomplished by providing a semiconductor laser diode of a double hetero structure characterized by an intermediate layer interposed between a substrate and a first clad layer or between a second clad layer and a cap layer, the intermediate layer having a single-layered structure or a multi-layered structure including at least two layers.

The intermediate layer has an energy band gap of a middle level between the energy band gaps of the two outer layers. In the multi-layered structure, the layers constituting the intermediate layers have energy band gaps which become smaller stepwise in a direction extending from the outer layer with the large energy band, namely, the first conductivity type clad layer or the second conductivity type clad layer to the outer layer with the small energy band, namely, the substrate or the cap layer.

The intermediate layer serves to reduce the barrier occurring at a boundary between the substrate and the clad layer and between the clad layer and the cap layer due to the energy band gap difference and thus make a flow of current smooth.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
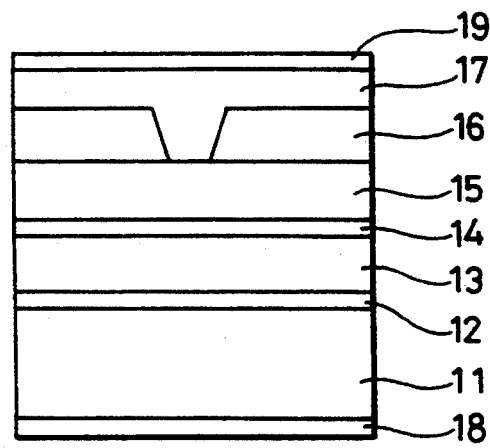
FIG. 1 is a schematic sectional view of a semiconductor laser diode with a conventional double hetero junction structure of the inner stripe type.
Figure 2:
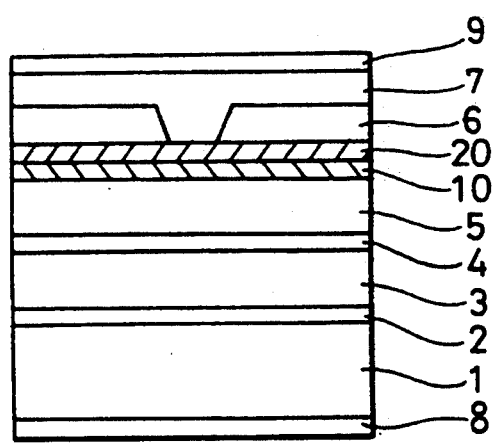
FIG. 2 is a schematic sectional view of a semiconductor laser diode in accordance with an embodiment of the present invention.

Referring to FIG. 2, there is illustrated a semiconductor laser diode in accordance with an embodiment of the present invention.

As shown in FIG. 2, the semiconductor laser diode of the present invention comprises a semiconductor substrate 1, a buffer layer 2, a clad layer 3 of a first conductivity type, an active layer 4 and a clad layer 5 of a second conductivity type, all layers being sequentially formed over the substrate 1. The semiconductor laser diode also has a first intermediate layer 10 formed over the second conductivity type clad layer 5 and a second intermediate layer 20 formed over the first intermediate layer 10. Over the second intermediate layer 20, a current limitation layer 6 and a cap layer 7 are sequentially formed. The semiconductor laser diode also comprises a metal electrode 8 of the first conductivity type and a metal electrode 9 of the second conductivity type grown beneath and over the substrate 1, respectively.

In accordance with the present invention, the first and second intermediate layers 10 and 20 are made of materials having an energy band gap smaller than those of the clad layers 3 and 5, but larger than that of the substrate 1 or the cap layer 7. The materials of the intermediate layers 10 and 20 may be of the same kind as the clad layers, but have a different composition from the clad layers.

The first intermediate layer 10 in contact with the clad layer 5 has an energy band gap larger than that of the second intermediate layer 20 in contact with the cap layer 7.

Figure 3:
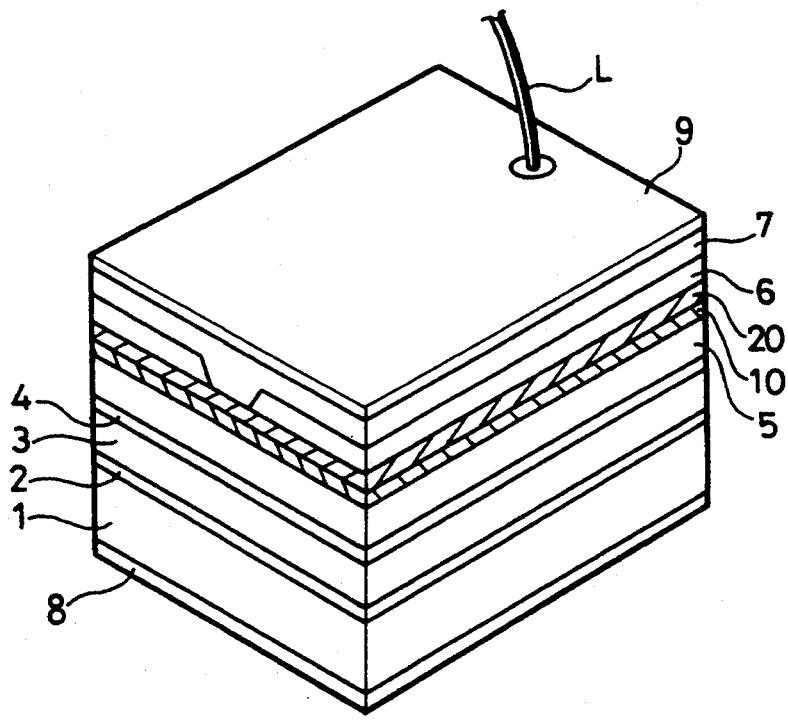
FIG. 3 is a perspective view of the overall structure of the semiconductor laser diode of FIG. 2.
Figure 4:
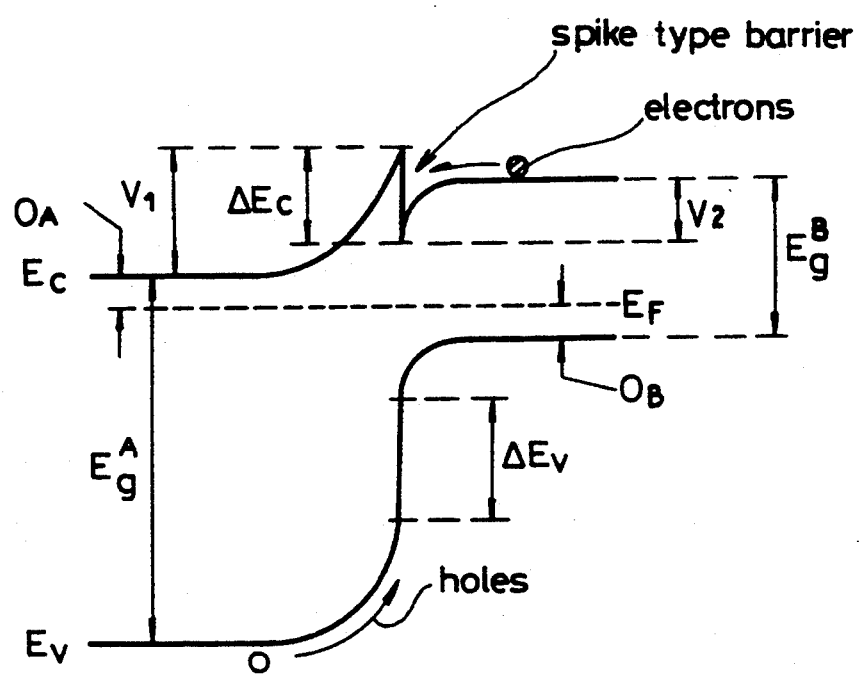
FIG. 4 is a diagram illustrating an energy band characteristic of the laser diode of FIG. 3.

FIG. 3 is a perspective view of the overall structure of the semiconductor laser diode as described above. FIG. 4 is a diagram illustrating an energy band characteristic of the laser diode of FIG. 3. In FIG. 3, the reference numeral L denotes a lead.

Now, operation of the laser diode of the present invention will be described.

As current is introduced in the second conductivity type metal electrode 9 via the lead L, it flows through the cap layer 7, the second and first intermediate layers 20 and 10 and the second conductivity type clad layer 5 and then enters the active layer 4. In the active layer 4, the current is radiatively recombined. Thereafter, the current passes through the first conductivity type clad layer 3, the buffer layer 2 and the substrate 1 and then the first conductivity type metal electrode 8.

The first and second intermediate layers 10 and 20 reduces a barrier caused by a discontinuous energy band level occurring when current flows from the cap layer 7 to the second conductivity type clad layer 5 or flows from the substrate 1 to the first conductivity type clad layer 3. As a result, the flowing of current becomes smooth.

FIG. 4 is a diagram of a variation in energy band, for explaining a barrier occurring at a boundary between two layers with different energy band gaps. When current flows from the cap layer 7 or the substrate 1 having a low energy band gap to the clad layer 3 or 5 having a high energy band gap, it meets a spike typed barrier at the boundary between the layers. The spike typed barrier interferes with the flowing of current, thereby causing a resistance component to occur. The resistance component results in a generation of heat.

Since the spike typed barrier is proportional to the energy band gap difference between two layers, it is possible to reduce greatly the spike typed barrier and thus make the flowing of current smooth by interposing the first and second intermediate layers 10 and 20 having an energy band gap of a middle level between the energy band gaps of the two outer layers.

Figure 5:
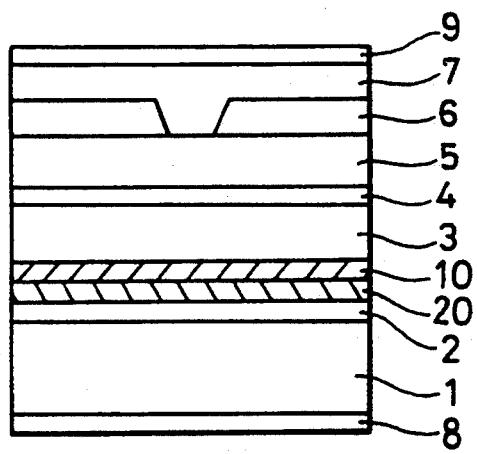
FIG. 5 is a schematic sectional view of a semiconductor laser diode in accordance with another embodiment of the present invention.

Referring to FIG. 5, there is illustrated a semiconductor laser diode in accordance with another embodiment of the present invention. In this embodiment, the intermediate layers are interposed between the substrate 1 and the first conductivity type clad layer 3.

In this case, the intermediate layer 20 in contact with the substrate 1 has an energy band gap smaller than that of the intermediate layer 10 in contact with the clad layer 3. The barrier which causes due to the energy band gap difference between the substrate 1 and the clad layer 3 is stepwise reduced, thereby enabling the series resistance component to be decreased.

Figure 6:
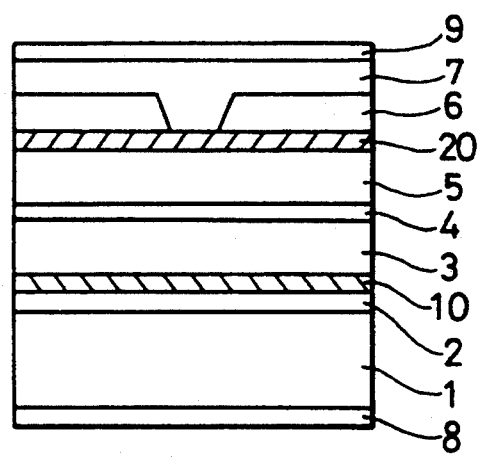
FIG. 6 is a schematic sectional view of a semiconductor laser diode in accordance with another embodiment of the present invention.

FIG. 6 also shows another embodiment of the present invention wherein intermediate layers 10 and 20 are interposed between the substrate 1 and the first conductivity type clad layer 3 and between the second conductivity type clad layer 5 and the cap layer 7, respectively. In this case, the effect of reducing the series resistance component may be enhanced.

Although the intermediate layers have been described as being two layers, in the above-mentioned embodiments, they may be of a structure including three or more layers. In this case, the layers constituting the intermediate layers have energy band gaps which become smaller stepwise in a direction extending from the outer layer with the large energy band (the first conductivity type clad layer or the second conductivity type clad layer) to the outer layer with the small energy band (the substrate or the cap layer).

As apparent from the above description, the present invention provides a semiconductor laser diode with the provision of intermediate layers. By the provision of intermediate layers, it is possible to reduce the series resistance component and thus achieve an operation with low current. As a result, a generation of heat is reduced, thereby enabling high output to be obtained. It is also possible to reduce the spike typed barrier caused by the energy band gap difference and thus provide a laser diode capable of operating with low current and improving the reliability.

Particularly, the laser diode of the present invention is useful for devices exhibiting a high energy band gap between the cap layer and the clad layer or between the substrate and the clad layer, such as short wavelength laser diodes.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor laser comprising:
   a substrate;
   an intermediate layer formed on said substrate;
   a first clad layer formed on said intermediate layer;
   an active layer formed on said first clad layer;
   a second clad layer formed on said active layer; and
   a cap layer formed on said second clad layer;
   wherein said intermediate layer has an energy band gap larger than that of said substrate and smaller than that of said first clad layer.

2. A semiconductor laser in accordance with claim 1, wherein the intermediate layer is made of the same materials as the first clad layer, but with a different composition.

3. A semiconductor laser in accordance with claim 1, wherein the intermediate layer has a multi-layered structure including a plurality of layers having different energy band gaps.

4. A semiconductor laser in accordance with claim 3, wherein the multiple layers constituting the intermediate layer have energy band gaps which become smaller stepwise in a direction extending from the first clad layer to the substrate.

5. A semiconductor laser in accordance with claim 1, further comprising a second intermediate layer interposed between said second clad layer and said cap layer.

6. A semiconductor laser comprising:

a substrate;

a first clad layer formed on said substrate;

an active layer formed on said first clad layer;

a second clad layer formed on said active layer;

an intermediate layer formed on said second clad layer, said intermediate layer has a multi-layered structure including a plurality of layers having different energy band gaps; and a cap layer formed on said intermediate layer;

wherein said intermediate layer has an energy band gap larger than that of said cap layer and smaller than that of said second clad layer.

7. A semiconductor laser in accordance with claim 6, wherein the multiple layers constituting said intermediate layer have energy band gaps which become smaller stepwise in a direction extending from the second clad layer to the cap layer.

* * * * *